United States Patent
Block et al.

(10) Patent No.: US 10,505,545 B1
(45) Date of Patent: Dec. 10, 2019

(54) SIMPLIFIED BIAS SCHEME FOR DIGITAL DESIGNS

(71) Applicant: GLOBALFOUNDRIES Inc., Grand Cayman (KY)

(72) Inventors: Stefan Block, Munich (DE); Jürgen Dirks, Holzkichen (DE); Herbert Johannes Preuthen, Dorfen (DE); Ulrich Hensel, Radeberg (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/190,922

(22) Filed: Nov. 14, 2018

(51) Int. Cl.
| | |
|---|---|
| H03K 19/0948 | (2006.01) |
| H01L 23/528 | (2006.01) |
| H01L 27/12 | (2006.01) |
| H01L 29/10 | (2006.01) |
| H01L 27/092 | (2006.01) |
| H01L 29/423 | (2006.01) |
| H01L 21/84 | (2006.01) |
| H01L 29/417 | (2006.01) |
| H01L 29/08 | (2006.01) |

(52) U.S. Cl.
CPC ..... *H03K 19/0948* (2013.01); *H01L 23/5286* (2013.01); *H01L 27/092* (2013.01); *H01L 27/1203* (2013.01); *H01L 29/1095* (2013.01); *H01L 29/42356* (2013.01); *H01L 21/84* (2013.01); *H01L 29/0847* (2013.01); *H01L 29/41783* (2013.01)

(58) Field of Classification Search
None
See application file for complete search history.

(56) References Cited

U.S. PATENT DOCUMENTS

| | | | |
|---|---|---|---|
| 2005/0017754 A1 | 1/2005 | Ker et al. | |
| 2013/0038374 A1* | 2/2013 | Chen ................... | H03K 19/0013 327/332 |
| 2014/0292374 A1* | 10/2014 | Giraud ............... | H03K 19/0016 326/98 |
| 2018/0335795 A1* | 11/2018 | Huang .................... | G05F 3/205 |

OTHER PUBLICATIONS

Okuhara et al., "Asymmetric Body Bias Control With Low-Power FD-SOI Technologies: Modeling and Power Optimization," in IEEE Transactions on Very Large Scale Integration (VLSI) Systems, vol. 26, No. 7, pp. 1254-1267, Jul. 2018, abstract only.

* cited by examiner

*Primary Examiner* — Jany Richardson
(74) *Attorney, Agent, or Firm* — Thompson Hine LLP

(57) ABSTRACT

Structures for a circuit including field-effect transistors and methods for fabricating and operating such circuits. A plurality of logic cells with a first well and a second well. The first well is directly connected with ground. A tap cell includes an inverter having an output connected with the second well. The inverter is configured to provide a bias voltage having a first state in which a positive voltage is supplied to the second well and a second state in which the second well is connected with ground.

20 Claims, 4 Drawing Sheets

US 10,505,545 B1

SIMPLIFIED BIAS SCHEME FOR DIGITAL DESIGNS

BACKGROUND

The invention relates generally to semiconductor devices and integrated circuit fabrication and, in particular, to structures for a circuit including field-effect transistors and methods for fabricating and operating such circuits.

Complementary-metal-oxide-semiconductor (CMOS) processes may be used to build a combination of p-type and n-type field-effect transistors that are used to construct, for example, logic cells. Field-effect transistors generally include a body defining a channel region, a source, a drain, and a gate electrode. When a control voltage exceeding a characteristic threshold voltage is applied to the gate electrode, carrier flow occurs in the channel region between the source and drain to produce a device output current.

Special tap cells may be periodically inserted in a CMOS digital layout based on tap rules and may be used during operation to bias the back gates of the p-type and n-type field-effect transistors. A positive voltage may be supplied from each tap cell to the n-wells of the p-type field-effect transistors in a logic cell to bias their back gates. A negative voltage may be supplied from each tap cell to the p-wells of n-type field-effect transistors in the logic cell to bias their back gates. The back gate bias may be used to enhance transistor performance and to reduce leakage power consumption. However, a problem with conventional back gate biasing is that a negative voltage is often not available in a design or in a system. Another problem with conventional back gate biasing is the area and power required for a bias generator needed to generate the positive and negative voltages. Yet another problem with conventional back gate biasing is the need for a net of analog bias lines to route the positive and negative voltages on a chip according to high voltage rules.

Improved structures for a circuit including field-effect transistors and methods for fabricating and operating such circuits are needed.

SUMMARY

In an embodiment of the invention, a structure for a circuit includes a plurality of logic cells with a first well and a second well. The first well is directly connected with ground. A tap cell includes an inverter having an output connected with the second well. The inverter is configured to provide a bias voltage having a first state in which a positive voltage is supplied to the second well and a second state in which the second well is connected with ground.

In an embodiment of the invention, a method includes continuously connecting a first well of a plurality of logic cells with ground, and switching a bias applied by a tap cell to a second well of the plurality of logic cells between a first state in which a bias voltage is supplied to the second well and a second state in which the second well is connected with ground.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
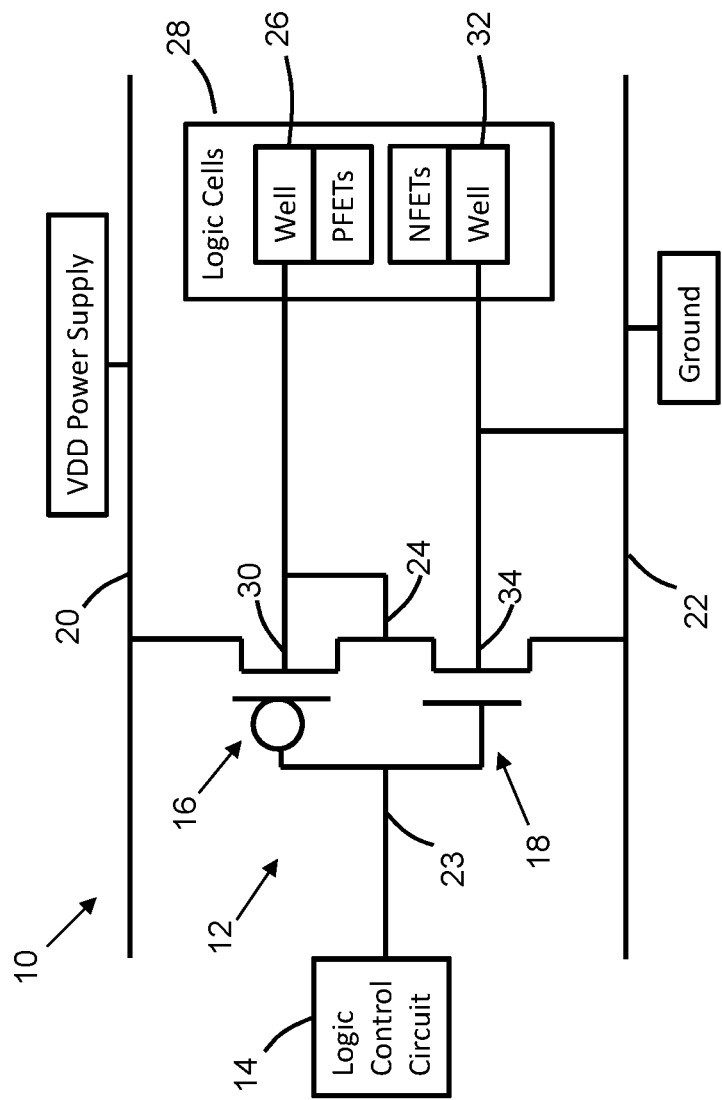
FIG. 1 is a schematic view of an electrical circuit for a tap cell in accordance with embodiments of the invention.

With reference to FIG. 1 and in accordance with embodiments of the invention, an electrical circuit 10 for a tap cell may include an inverter 12 providing a bias switch that is switched by a digital control signal originating from a logic control circuit 14. The inverter 12 includes a p-type field-effect transistor 16 and an n-type field-effect transistor 18 having gates that are coupled together with each other by wiring in an electrical path (e.g., wiring in an interconnect structure). The coupled gates of the field-effect transistors 16, 18 are commonly connected by wiring in the electrical path with an output of the logic control circuit 14. The drains of the field-effect transistors 16, 18 are also coupled together with each other by wiring in an electrical path. The source of the p-type field-effect transistor 16 of the inverter 12 is connected by wiring in an electrical path with a positive ($V_{DD}$) power rail 20 of a power supply for the chip on which circuit 10 is located. The source of the n-type field-effect transistor 18 of inverter 12 is connected by wiring in an electrical path with a reference ($V_{SS}$) power rail 22 of the power supply. The reference voltage at the reference power rail 22 may be ground (e.g., 0 volts).

The inverter 12 includes an input 23 that receives the digital control signal from the logic control circuit 14 and an output 24 that is connected by wiring in an electrical path with a well 26. A multiple-state bias voltage is supplied from the output 24 of the inverter 12 to the well 26. The well 26 may provide back gates for p-type field-effect transistors arranged in logic cells 28 on the chip. In an embodiment, the well 26 is doped with an n-type impurity to provide an n-well. The p-type field-effect transistor 16 of the inverter 12 includes a back gate 30 that is available to be electrically biased. The output 24 of the inverter 12 is also connected by wiring in an electrical path with the back gate 30 of the p-type field-effect transistor 16 such that the well 26 and back gate 30 are at the same potential during device operation. In an embodiment, the back gate 30 of the p-type field-effect transistor 16 may be a portion of the well 26.

The logic cells 28 also include n-type field-effect transistors that are arranged in the logic cells 28 along with the p-type field-effect transistors. A well 32 may provide back gates for the n-type field-effect transistors arranged in the logic cells 28. In an embodiment, the well 32 is doped with a p-type impurity to provide a p-well. The well 32 is directly connected by wiring in an electrical path with the reference ($V_{SS}$) power rail 22 and, as a consequence, may be directly connected with (i.e., directly tied to) the reference voltage (e.g., ground). The well 32 is not connected with the output 24 of the inverter 12, and the bias voltage supplied to the well 32 is constant and not varied by the operation of the inverter 12. The n-type field-effect transistor 18 includes a back gate 34 that is available to be electrically biased. The back gate 34 of the n-type field-effect transistor 18 may be connected by wiring in an electrical path with the reference ($V_{SS}$) power rail 22.

The field-effect transistors 16, 18 and the field-effect transistors of the logic cells 28 may be fabricated by complementary-metal-oxide-semiconductor (CMOS) processes during front-end-of-line (FEOL) processing. The electrical paths of the circuit 10 may be provided by wiring formed in an interconnect structure by middle-of-line (MOL) and back-end-of-line (BEOL) processing.

During operation, the circuit 10 may be used to control a multiple-state bias voltage that is applied to the well 26 between a level or state in which the well 26 is biased with a positive voltage and a level or state in which the well 26 is grounded (i.e., zero bias), and thereby provide a reverse body bias to the p-type field-effect transistors in the logic cells 28. When the input 23 of the inverter 12 receives a low digital control signal (i.e., an enable signal) from the logic control circuit 14, the inverter 12 is switched to a state in which the well 26 is connected through the output 24 of the inverter 12 with the positive ($V_{DD}$) power rail 20 and a positive voltage that is equal to the voltage of the positive ($V_{DD}$) power rail 20 is applied as a bias voltage to the well 26. When the input 23 of the inverter 12 receives a high digital control signal from the logic control circuit 14, the inverter 12 is switched to a state in which the well 26 is connected through the output 24 of the inverter 12 with the reference ($V_{SS}$) power rail 22 and grounded to apply zero bias to the well 26 as the bias voltage. The well 32 of the logic cells 28 is continuously grounded to the reference ($V_{SS}$) power rail 22 during the operation of the circuit 10 and independent of the application of the bias voltage to the well 26.

The reverse body bias provided by the circuit 10 raises the required threshold voltage for the p-type field-effect transistors of the logic cells 28 to turn on, which may result in lower speed, but also may lower the leakage current, which is useful from a power efficiency standpoint. When inactive, the p-type field-effect transistors of the logic cells 28 may be placed in a "sleep" mode in order to retain the stored data. A clock gate may be used to ensure that the dynamic power to the p-type field-effect transistors of the logic cells 28 is reduced during "sleep" mode. The reverse body bias may provide additional power saving by reducing the leakage current if the back gate is biased by the circuit 10 with positive bias, in addition to the clock-gating, during "sleep" mode.

The direct connection of the well 32 with the reference ($V_{SS}$) power rail 22 eliminates the need for a negative voltage to provide back gate biasing. In conjunction with the utilization of the positive ($V_{DD}$) power rail 20 to provide the positive bias voltage to the circuit 10, a bias generator is not required to generate positive and negative bias voltages, which conserves area on the chip and power consumption. Because a bias generator is not required, the related net of analog bias lines is also not required to route positive and negative bias voltages on the chip. In addition, the continuous grounding of the well 32 may eliminate the need for an oppositely-doped deep well to isolate the well 32 from the substrate.

Figure 2:
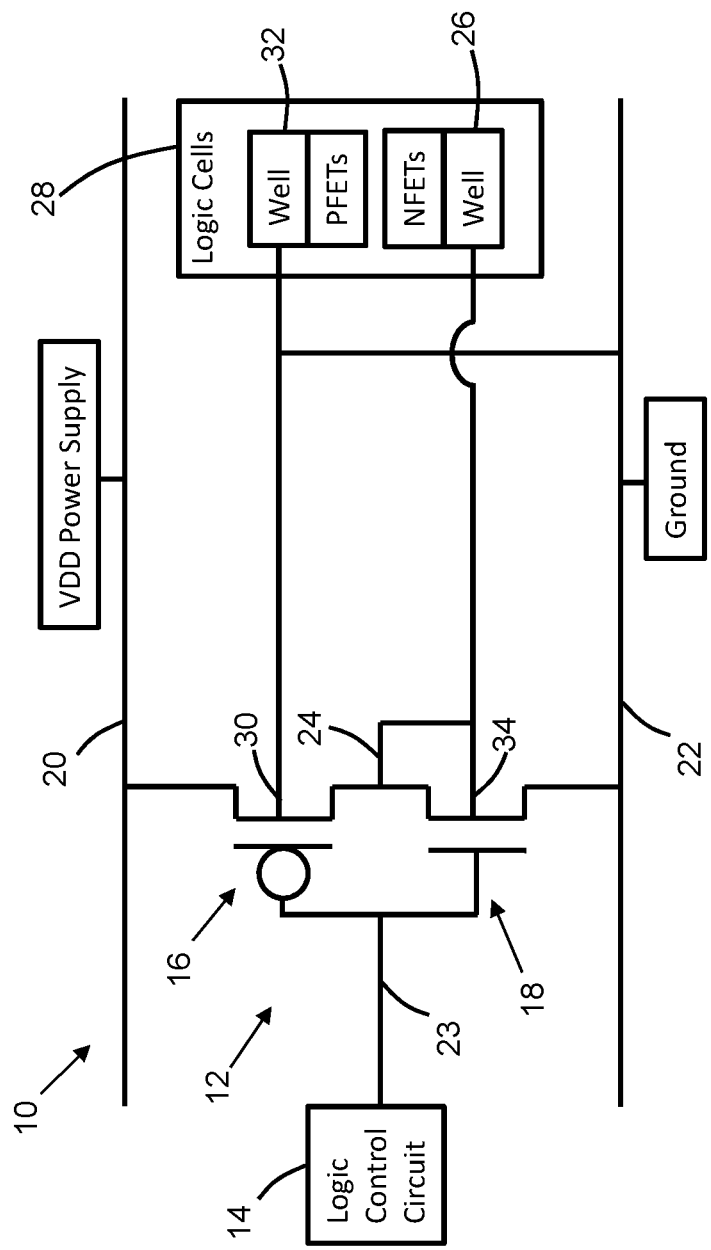
FIG. 2 is a schematic view of an electrical circuit for a tap cell in accordance with embodiments of the invention.

With reference to FIG. 2 in which like reference numerals refer to like features in FIG. 1 and in accordance with embodiments of the invention, the circuit 10 may be configured to provide a forward body bias instead of a reverse body bias. To that end, the output 24 of the inverter 12 may be connected by wiring in an electrical path with the well 26 and by wiring in an electrical path with the back gate of the n-type field-effect transistor 18. The well 32 of the logic cells 28 and the back gate of the p-type field-effect transistor 16 are connected by wiring in electrical paths to the reference ($V_{SS}$) power rail 22. The well 32 is not connected with the output 24 of the inverter 12.

During operation, the circuit 10 may be used to control a multiple-state bias voltage that is applied to the well 26 between a level or state in which the well 26 is biased with a positive voltage and a level or state in which the well 26 is grounded (i.e., zero bias), and thereby provide the forward body bias to the p-type field-effect transistors in the logic cells 28. When the input 23 of the inverter 12 receive a high digital control signal (i.e., an enable signal) from the logic control circuit 14, the inverter 12 is switched to a state in which the well 26 is connected through the inverter 12 with the positive ($V_{DD}$) power rail 20 and a positive voltage that is equal to the voltage of the positive ($V_{DD}$) power rail 20 is applied as a bias voltage to the well 26. When the input 23 of the inverter 12 receive a low digital control signal from the logic control circuit 14, the inverter 12 is switched to a state in which the well 26 is connected with the reference ($V_{SS}$) power rail 22 and grounded to apply zero bias to the well 26 as the bias voltage. The well 32 of the logic cells 28 is continuously grounded to the reference ($V_{SS}$) power rail 22 during the operation of the circuit 10 and independent of the application of the bias voltage to the well 26.

The forward body bias lowers the required threshold voltage for the p-type field-effect transistors of the logic cells 28 to turn on, which results in higher speed, but also increases the leakage current. The forward bias may be used to compensate for process variations that cause certain p-type field-effect transistors to be slower than a typical transistor. The positive bias may be activated for the slower p-type field-effect transistors, but not activated for field-effect transistors that are faster than the typical transistor. Alternatively, the forward body bias may be applied in a mode dependent manner. For example, the bias may be activated if the logic cells 28 are operating in a high speed mode, but not activated if the logic cells 28 are operating is in a normal (low speed) mode.

Figure 3:
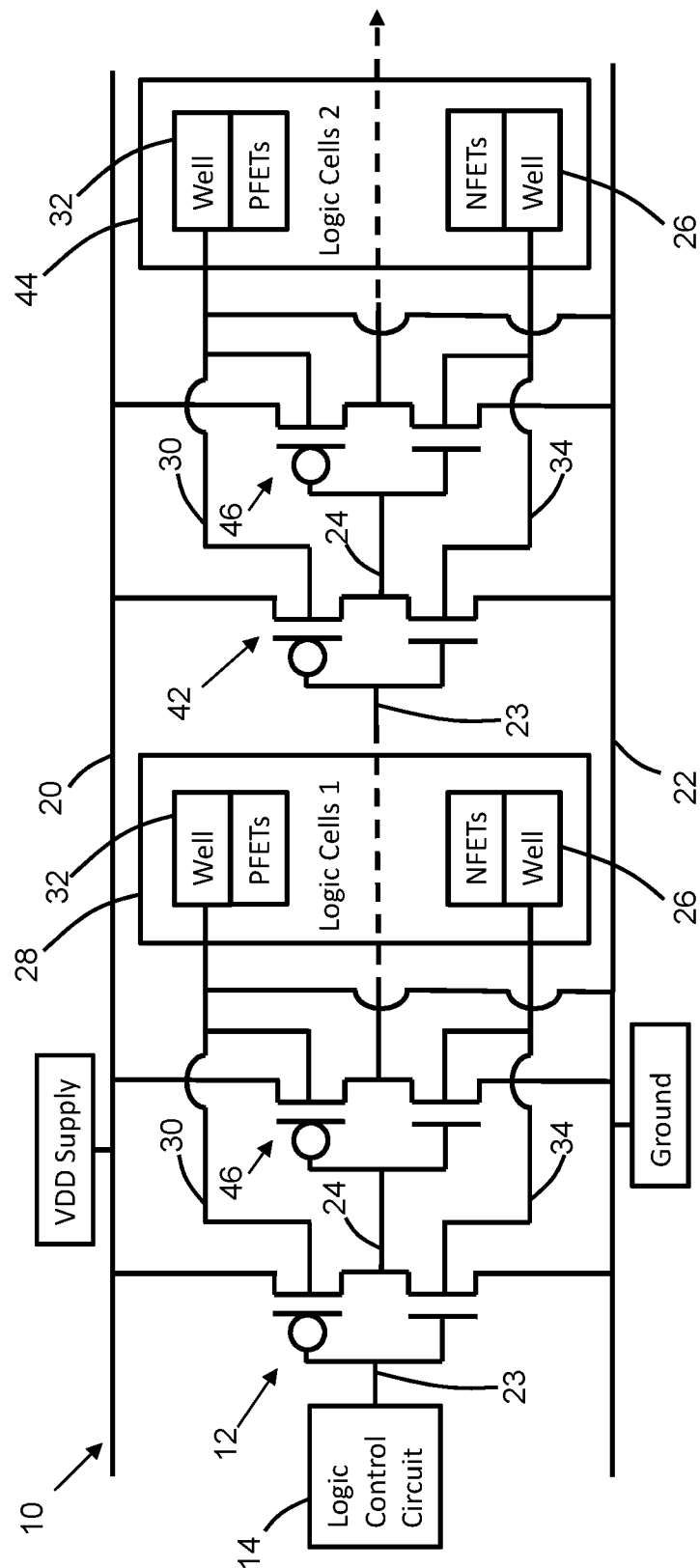
FIG. 3 is a schematic view of an electrical circuit for a tap cell in accordance with embodiments of the invention.

With reference to FIG. 3 in which like reference numerals refer to like features in FIG. 2 and in accordance with embodiments of the invention, the output 24 of the inverter 12 may be connected in an electrical path with the input 23 of another inverter 42, as indicated by the dashed lines in FIG. 3. The bias voltage that is applied to the well 26 of the logic cells 28 may also be output from the inverter 12 as an input to the inverter 42 providing a two-state bias enable signal for controlling the biasing of the well 26 of another set of logic cells 44 with either a positive voltage (e.g., VDD) or ground.

An output inverter 46 is inserted between the output 24 of the inverter 12 and the input 23 of the inverter 42. The output inverter 46 inverts the control signal output by the inverter 12 to switch the polarity of the bias enable signal (i.e., provide an opposite polarity) delivered to the inverter 42.

The output 24 of the inverter 42 may be supplied to the inverters in additional tap cells, as indicated by the dashed line with the single-headed arrow, to further daisy chain the bias enable signal and to bias the well 26 in additional sets of logic cells.

Figure 4:
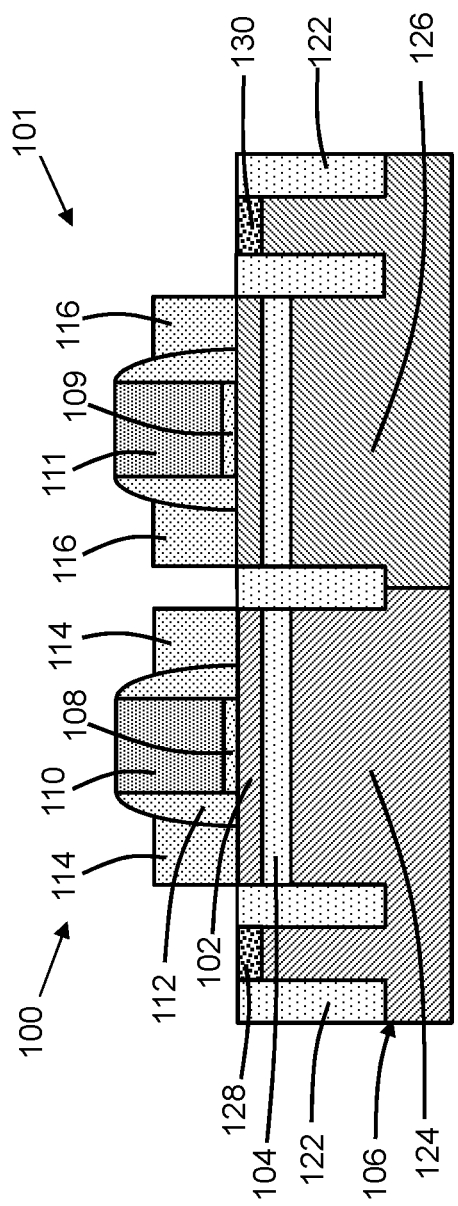
FIG. 4 is a cross-sectional view of field-effect transistors that may be used to construct the tap cell and logic cells of FIGS. 1-3.

With reference to FIG. 4 in which like reference numerals refer to like features in FIG. 1, field-effect transistors 100, 101 are shown that may be used as device structures for the field-effect transistors 16, 18 of the inverter 12 and the field-effect transistors of the logic cells 28. The field-effect transistors 100, 101 may be fabricated using a semiconductor-on-insulator (SOI) wafer by CMOS processes during FEOL processing. The SOI wafer includes a device layer 102, a buried insulator layer in the form of a buried oxide (BOX) layer 104, and a substrate 106. The device layer 102 is separated from the substrate 106 by the intervening BOX layer 104 and is considerably thinner than the substrate 106. The device layer 102 and the substrate 106 may be composed of a single-crystal semiconductor material, such as single-crystal silicon. In an embodiment, the SOI substrate may be an extremely thin semiconductor-on-insulator (ET-SOI) substrate and may be used to fabricate the field-effect transistors 100, 101 using CMOS FEOL processes as fully-depleted SOI devices (FDSOI).

The field-effect transistor 100 includes a gate dielectric 108 and a gate electrode 110 that is separated from the device layer 102 by the gate dielectric 108. The field-effect transistor 101 includes a gate dielectric 109 and a gate electrode 111 that is separated from the device layer 102 by the gate dielectric 109. The gate dielectrics 108, 109 may be composed of a dielectric or insulating material, and the gate electrodes 110, 111 may be composed of a conductor, such as doped polysilicon or one or more metals. Non-conductive sidewall spacers 112 may be provided adjacent to the sidewalls of the gate electrodes 110, 111.

Raised source/drain regions 114 are arranged on opposite sides of the gate electrode 110, and raised source/drain regions 116 are arranged on opposite sides of the gate electrode 111. As used herein, the term "source/drain region" means a doped region of semiconductor material that can function as either a source or a drain of a field-effect transistor. The semiconductor material of the source/drain regions 114 may be silicon, and may contain an n-type dopant (e.g., phosphorus (P) and/or arsenic (As)) that provides n-type conductivity. The semiconductor material of the source/drain regions 116 may be silicon-germanium and may contain a p-type dopant (e.g., boron (B)) that provides p-type conductivity.

A portion of the device layer 102 between the source/drain regions 114 and vertically beneath the gate electrode 110 constitutes a transistor body through which a gated current is switched through a channel region. A portion of the device layer 102 between the source/drain regions 116 and vertically beneath the gate electrode 111 constitutes a transistor body through which a gated current is switched through a channel region. Trench isolation regions 122 bound the transistor bodies.

A well 124 is formed in the substrate 106 and provides a back gate for the field-effect transistor 100. The transistor body of the field-effect transistor 100 is arranged vertically between the well 124 and the gate electrode 110. In an embodiment, the semiconductor material of the well 124 may contain a p-type dopant (e.g., boron (B)) that provides p-type conductivity. A heavily-doped contact 128 of the same conductivity type provide a connection with the well 124.

Similarly, a well 126 is formed in the substrate 106 and provides a back gate for the field-effect transistor 101. The transistor body of the field-effect transistor 101 is arranged vertically between the well 126 and the gate electrode 111. In an embodiment, the semiconductor material of the well 126 may contain an n-type dopant (e.g., phosphorus (P) and/or arsenic (As)) that provides n-type conductivity. A heavily-doped contact 130 of the same conductivity type provides a connection with the well 126.

The well 124 may represent the well 32 in FIGS. 1-3, and the well 126 may represent the well 26 in FIGS. 1-3. The well 126 may be switched by the operation of the inverter 12 of circuit 10 between the different bias levels in which the well 126 is either biased or grounded. The well 124 may have a direct connection to ground that is not switched by the inverter 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first plurality of logic cells including a first well and a second well, the first well directly connected with ground;
   a first tap cell including a first inverter having an output connected with the second well of the first plurality of logic cells, the first inverter configured to provide a first bias voltage having a first state in which a positive voltage is supplied to the second well of the first plurality of logic cells and a second state in which the second well of the first plurality of logic cells is connected with ground;
a second plurality of logic cells including a first well and a second well; and
a second tap cell including a second inverter having an input connected with the output of the first inverter and an output connected with the second well of the second plurality of logic cells.

2. The structure of claim 1 wherein the first well contains a p-type dopant, and the second well contains an n-type dopant.

3. The structure of claim 2 wherein each of the first plurality of logic cells includes an n-type field-effect transistor arranged over the first well and a p-type field-effect transistor arranged over the second well.

4. The structure of claim 3 wherein the first well provides a back gate of the n-type field-effect transistor of each of the first plurality of logic cells, and the second well provides a back gate of the p-type field-effect transistor of each of the first plurality of logic cells.

5. The structure of claim 1 wherein each of the first plurality of logic cells includes a p-type field-effect transistor, the second well is located in a substrate of a silicon-on-insulator wafer, and the p-type field-effect transistor of each of the first plurality of logic cells is separated from the second well by a buried insulator layer of the silicon-on-insulator wafer.

6. The structure of claim 5 wherein each of the first plurality of logic cells includes an n-type field-effect transistor, the first well is located in the substrate of the silicon-on-insulator wafer, and the n-type field-effect transistor of each of the first plurality of logic cells is separated from the first well by the buried insulator layer of the silicon-on-insulator wafer.

7. The structure of claim 1 further comprising:
a positive ($V_{DD}$) power rail,
wherein the first tap cell is configured to connect the second well with the positive ($V_{DD}$) power rail to provide the positive voltage to the second well when the first inverter is in the first state.

8. The structure of claim 1 wherein the first inverter includes a p-type field-effect transistor with a back gate, and the output of the first inverter is further connected with the back gate of the p-type field-effect transistor.

9. The structure of claim 1 wherein the first inverter includes an n-type field-effect transistor with a back gate, and the output of the first inverter is further connected with the back gate of the n-type field-effect transistor.

10. The structure of claim 1 wherein the first well of the second plurality of logic cells is directly connected with ground, the input of the second inverter is configured to receive the first bias voltage from the output of the first inverter as a bias enable signal, and the second inverter is configured to apply a second bias voltage to the second well of the second plurality of logic cells based on the bias enable signal.

11. The structure of claim 10 further comprising:
a third inverter arranged between the output of the first inverter and the input of the second inverter, the third inverter configured to switch a polarity of the first bias voltage from the first inverter to provide the bias enable signal.

12. The structure of claim 1 further comprising:
a logic control circuit connected with an input of the first inverter, the logic control circuit configured to supply a control signal to the input of the first inverter to provide the first bias voltage with the first state and the second state.

13. The structure of claim 1 further comprising:
a negative ($V_{SS}$) power rail,
wherein the first well is directly connected to ground at the negative ($V_{SS}$) power rail.

14. The structure of claim 1 wherein the first well is not connected with the output of the first inverter of the first tap cell.

15. A method comprising:
continuously connecting a first well of a first plurality of logic cells with ground;
switching a first bias applied by a first tap cell to a second well of the first plurality of logic cells between a first state in which a first bias voltage is supplied to the second well of the first plurality of logic cells and a second state in which the second well of the first plurality of logic cells is connected with ground; and
supplying the first bias voltage from the first tap cell to a second tap cell as a bias enable signal.

16. The method of claim 15 wherein the first tap cell includes an inverter, and further comprising:
supplying a digital control signal to the inverter of the first tap cell to switch the first bias between the first state and the second state.

17. The method of claim 15 wherein the first bias voltage is supplied by the first tap cell from a positive ($V_{DD}$) power rail to the second well of the first plurality of logic cells.

18. The method of claim 15 further comprising:
switching a second bias applied by the second tap cell to a well of a second plurality of logic cells based on the bias enable signal.

19. The method of claim 18 wherein the second bias supplied by the first tap cell to the well of the second plurality of logic cells includes a first state in which a second bias voltage is supplied to the well of the second plurality of logic cells and a second state in which the well of the second plurality of logic cells is connected with ground.

20. The method of claim 15 further comprising:
switching a polarity of the bias voltage supplied from the first tap cell to the second tap cell as the bias enable signal.

* * * * *